United States Patent [19]

Brühlmeier et al.

[11] Patent Number: 5,252,927
[45] Date of Patent: Oct. 12, 1993

[54] DEVICE FOR MONITORING CORONA DISCHARGE IN A DYNAMOELECTRIC MACHINE WITH DETECTION PROBE MOVABLE IN LONGITUDINAL AND CIRCUMFERENTIAL DIRECTION

[75] Inventors: Paul Brühlmeier, Wettingen; Jitka Fuhr, Dübendorf; Martin Hässig, Rümlang; René Kohler, Schinznach-Bad; Albert Kopp, Windisch, all of Switzerland

[73] Assignee: Asea Brown Boveri Ltd., Baden, Switzerland

[21] Appl. No.: 778,665

[22] Filed: Oct. 18, 1991

[30] Foreign Application Priority Data

Oct. 22, 1990 [EP] European Pat. Off. ........... 90120260

[51] Int. Cl.⁵ ..................... G01R 31/34; G01R 31/06
[52] U.S. Cl. ............................ 324/546; 324/158 MG; 324/536; 324/545
[58] Field of Search .................. 324/545–547, 324/536, 158 MG

[56] References Cited

U.S. PATENT DOCUMENTS

| | | |
|---|---|---|
| 2,890,407 | 6/1959 | Huehn et al. |
| 4,238,733 | 12/1980 | Freeman .................. 324/158 MG |
| 4,949,001 | 8/1990 | Campbell. |
| 4,996,486 | 2/1991 | Posedel ........................... 324/545 |

FOREIGN PATENT DOCUMENTS 2195771 4/1988 United Kingdom.

OTHER PUBLICATIONS

Cigre Report, "Diagnostics of HV Machine Insulation-From Inspection to Continuous Monitoring", A. Kelen, Cigre Symposium May 1987, Vienna 1987, pp. 1020-2005.

Cigre Paper 15/33-12, "Partial Discharge Pattern Recognition-A Tool for Diagnosis and Monitoring of Ageing", B. Fruth and J. Fuhr, Cigre Session Aug. 26-Sep. 1, 1990.

Primary Examiner—Gerard R. Strecker
Assistant Examiner—Diep Do
Attorney, Agent, or Firm—Oblon, Spivak, McClelland, Maier & Neustadt

[57] ABSTRACT

In the device for detecting partial discharges in winding elements of an electrical machine, the winding element to be investigated is sampled over its length, with high voltage applied, by means of a drivable probe and the radio frequency signals initiated by the partial discharges are received by means of an antenna. The antenna signal is detected and evaluated in a test set (11) connected downstream. The probe is arranged on a support which can be conveyed, under remote control, in the machine longitudinal direction, by means of tension cables (4, 5) or an axle rod, or is provided with a dedicated drive.

9 Claims, 5 Drawing Sheets

DEVICE FOR MONITORING CORONA DISCHARGE IN A DYNAMOELECTRIC MACHINE WITH DETECTION PROBE MOVABLE IN LONGITUDINAL AND CIRCUMFERENTIAL DIRECTION

BACKGROUND OF THE INVENTION

1. Field of the Invention

The invention relates to a device for detecting partial discharges in winding elements of an electrical machine, in which device the winding element to be investigated is sampled over its length, with high voltage applied, by means of a drivable probe and the radio frequency signals initiated by the partial discharges are received by means of an antenna and are detected and evaluated in a test set connected downstream.

The point of origin for the invention is a prior art as results, for example, from the CIGRE Report "Diagnosis of HV Machine Insulation — From Inspection to Continuous Monitoring" by A. Kelen, CIGRE Symposium 05-87, Vienna 1987, pages 1020-05.

2. Discussion of Background

The electrical insulation systems of the stator windings in rotating electrical machines are subject to aging processes which are mainly caused by mechanical, thermal and electrical stresses. These stresses produce weak points in the associated insulating materials, in which dangerous partial discharges (PD) occur in the event of an operating stress. The so-called slot discharges are the most worrying PD phenomena in the machine insulation system. Early detection and localization of the slot discharges protects the power generators and consumers against uncontrolled failures in power supply networks on the one hand and prevents destruction of the insulation on the other hand, since most defects which are discovered early are repairable.

In the CIGRE report quoted initially, the author provides a comprehensive summary of the measurement processes and devices which were known at the time for detecting partial discharges. However, the report is limited to a rather summary representation of the processes and equipment used hitherto. A more detailed report on partial discharges and their diagnosis, and the interpretation of the measurement results, is published in CIGRE Paper 15/33-12, B. Fruth, J. Fuhr "Partial Discharge Pattern Recognition — A Tool for Diagnosis and Monitoring of Aging", distributed at the CIGRE 1990 Session, 26 August - 1 September 1990.

Partial discharges occur only in the event of sufficient electrical stress (rated voltage) of the insulation. In order to be able to identify a slot discharge unambiguously, it is necessary to work with high voltage applied to the stator winding. However, this is linked to endangering the test personnel and, as a rule, requires the rotor to be removed.

SUMMARY OF THE INVENTION

Proceeding from the prior art, the invention is based on the object of specifying a device for detecting partial discharges which permits detection and localization of partial discharges, with high voltage applied, without endangering the operating personnel.

According to the invention, the solution of this object results from the probe being arranged on a support which can be conveyed, under remote control, in the machine longitudinal direction, by means of tension cables, tension strips or tension rods, or is provided with a dedicated drive.

In this case, the size of the machine air gap and the position of the machine axis primarily determine which of the two alternatives is used. The solution with cable trains or tension rods is particularly suitable for large turbo-generators with a considerable air gap length. In the case of hydro-generators, which, as a rule, have a comparatively small air gap, and for machines with a vertical axis, the variant with tensile strips is preferred. Both variants are characterized by good cost-effectiveness, since there is no need for time-consuming removal of the rotor.

If the rotor is nonetheless removed for repair or service purposes, the variant with a dedicated drive is preferred.

In the case of a first further development of the invention, the tension cables or tension rods preferably lead on both sides of the rotor to probe supports. These are mounted, such that they can move in the circumferential direction, on a machine part, preferably the machine fan or a suitable auxiliary device, which is rotationally symmetrical with respect to the rotor axis. Simple mounting of the probe supports is achieved in this way, particularly in the case of radial fans. In the case of axial fans, an auxiliary device which is placed on the external circumference or the fan support (hub) of the axial fan, is used for mounting the probe supports In the case of hydromachines with a vertical axis, the variant with tensile rods or tensile strips and with only a single probe support is advantageous, since the underside of the machine is less easily accessible in the case of such machines.

The probe itself has at least one AM antenna. The antenna signal is either supplied (unamplified) to the test set outside the machine, or the probe contains an antenna signal amplifier, or the probe contains a complete, miniaturized AM receiver, in which the received signal is demodulated and supplied to the test set as an AF signal.

The invention is explained in more detail below on the basis of the drawings.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
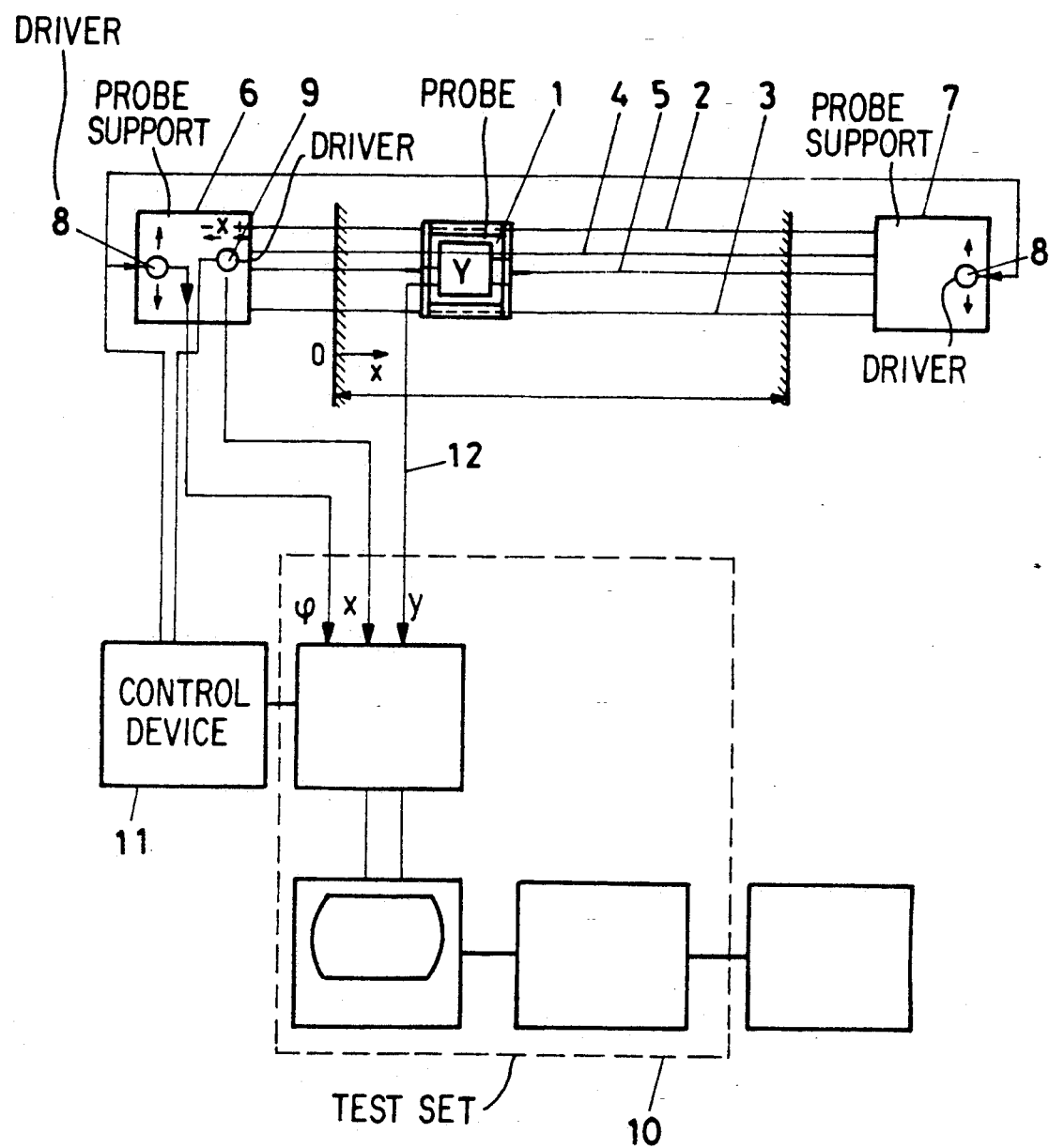
FIG. 1 shows a schematic view of the device for detecting partial discharges, partially in block diagram form.

Referring now to the drawings, wherein like reference numerals designate identical or corresponding parts throughout the several views, FIG. 1 is partially shown in block diagram form for reasons of clarity. A probe 1 can be moved in the machine longitudinal direction on supporting cables 2, 3 in the air gap of a large electrical machine, by means of tension cables 4, 5. The tension and supporting cables are insulated for potential isolation and for safety reasons. They lead on both sides of the machine, and outside the air gap in each case to a probe support 6, 7. Both probe supports 6, 7 have a drive device 8 for conveying the probe supports 6, 7, and hence the probe 1 itself, in the circumferential direction. The left probe support 6 furthermore comprises a drive device 9 for the tension cables 4, 5, in order that the probe 1 can be moved in the machine longitudinal direction through the air gap. All the drive devices 8 and 9 are coupled to rotation sensors, known per se, which supply to a test set 10 a signal corresponding to the distance x traveled by the probe 1 in the machine longitudinal direction and the angle Φ in the circumferential direction. The output signal from the probe 1 itself (signal y) is furthermore supplied to the test set 10. The drive devices 8 and 9 are controlled via a control device 11.

The probe 1 is connected to the test set 10 via a shielded cable 12. In the simplest case, the probe 1 contains an antenna for the reception of amplitude modulated RF signals. In addition, the probe can also have an amplifier for such RF signals. Finally, the probe 1 can be fitted with a complete AM receiver with a demodulator, a demodulated AF signal being produced at its output. The fittings of the test set 10 also correspond to the respective construction of the probe 1, these fittings being governed by the furnishing of the probe 1.

In the case of a probe fitted merely with an AM antenna, the AM signal supplied to the test set 10 is amplified and demodulated. After further processing (amplification) in the test set, in the simplest case the signal is supplied to the Y-input of an XY plotter, while the X-signal representing the distance traveled by the probe in the machine longitudinal direction is connected to the X-input of the plotter. In a more complex design, the signal is digitized in the test set 10 and supplied to an electronic data processing unit in which XY-graphics are likewise produced. If an RF amplifier is already integrated into the probe, the RF signal can be supplied directly to a demodulator in the test set 10. In the case of a probe provided with an AM receiver and demodulator, the audio frequency input signal can be further processed directly in the test set 10.

If the probe 1 is moved through the air gap with the rated voltage applied to the stator winding of the machine, the antenna receives amplitude modulated RF signals. In the case of insulation defects or insulation weak points, the antenna signal is characteristically changed at these points. The diagram drawn in this manner thus allows a conclusion to be reached on the insulation state of the stator winding in an unambiguous manner.

Figure 2:
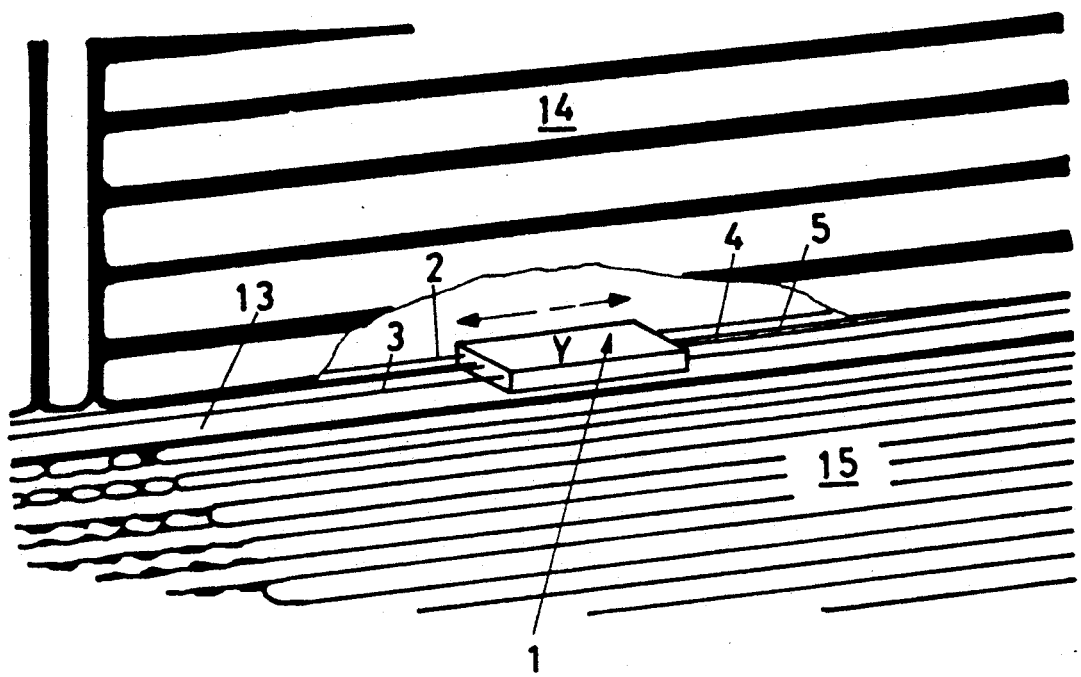
FIG. 2 shows a view of a probe which can be moved by means of cable trains in the air gap of a turbo-generator.
Figure 3:
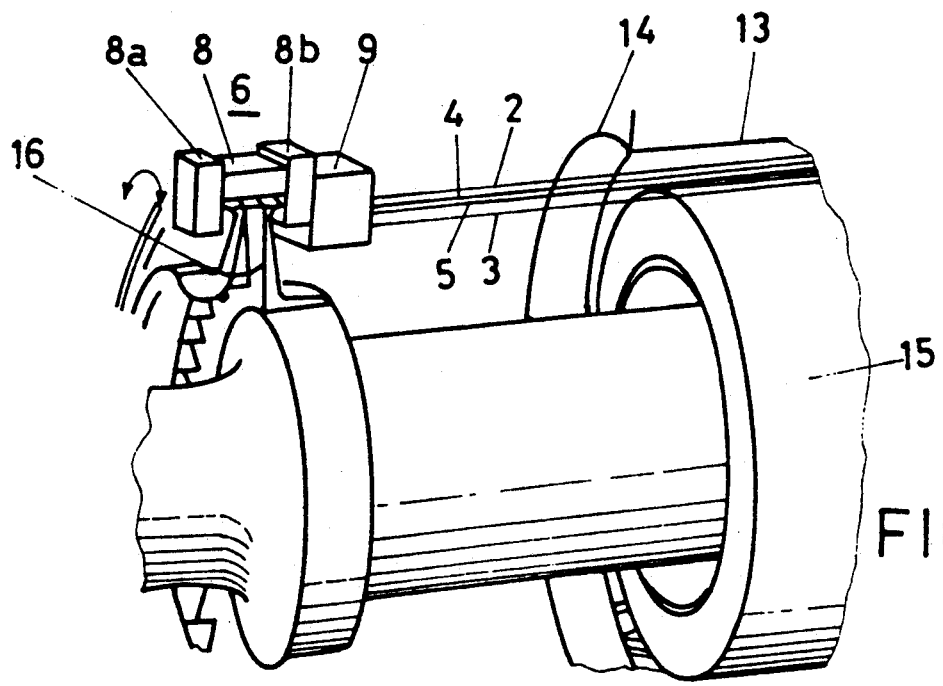
FIG. 3 shows a view onto one of two probe supports on the machine end, the probes being mounted on machine fan.
Figure 4:
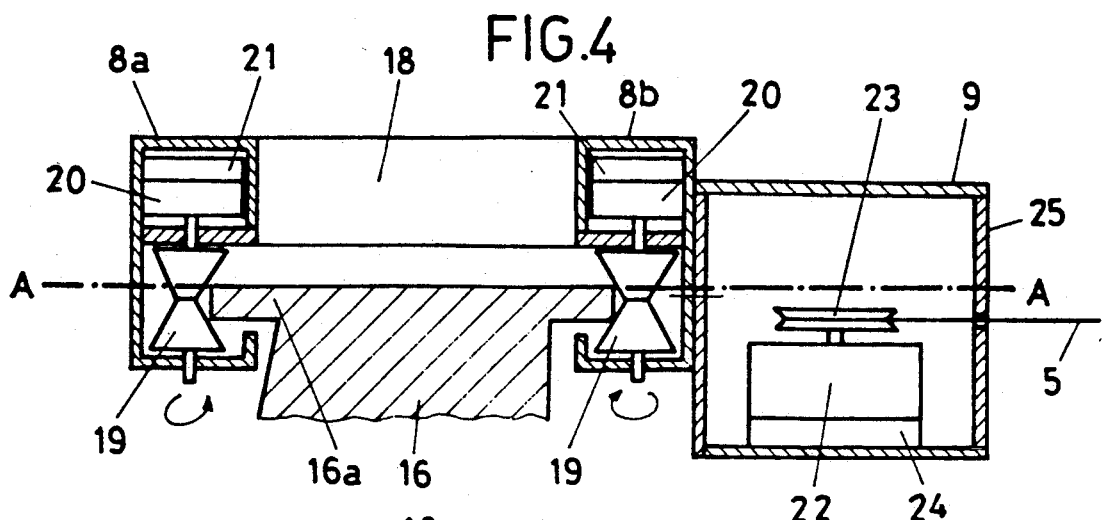
FIG. 4 shows a section through the probe support according to FIG. 3 with a machine fan designed as a radial fan.
Figure 5:
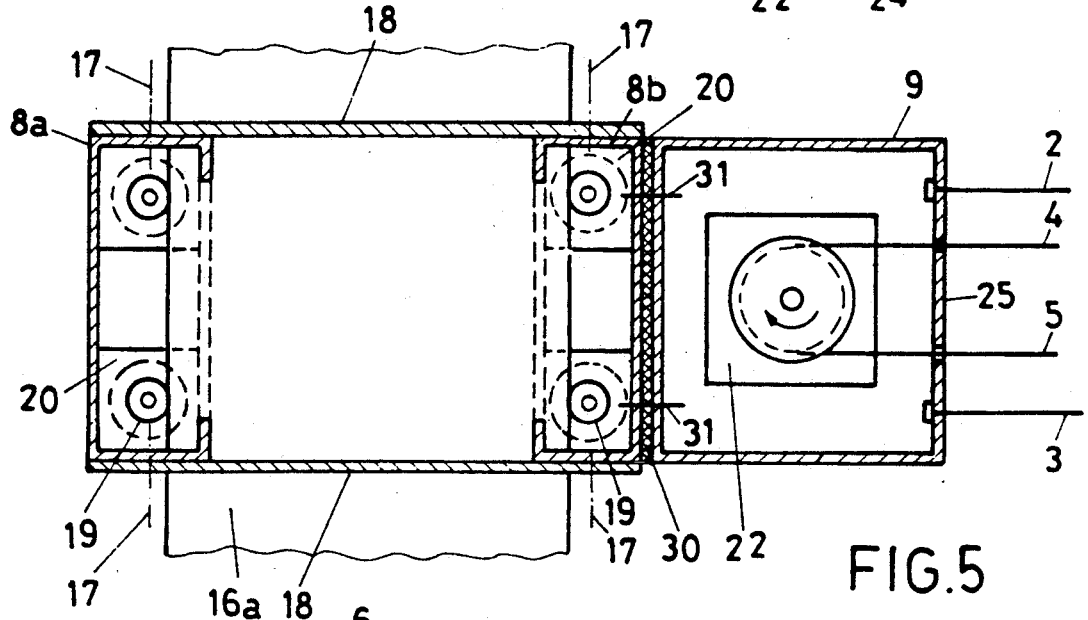
FIG. 5 shows a section through the probe support according to FIG. 4 along the line AA.

FIG. 2 shows a perspective view of a section from a turbo-generator. The probe 1, guided on the supporting cables 2, 3 and movable by the tension cables 4, 5, can be seen in the air gap 13 between the stator 14 and the rotor 15. FIG. 3 shows the arrangement of the left probe support 6 mounted on the external circumference of the radial fan 16 of the rotor. The probe support 6 is of modular construction and comprises the drive device 8 for moving the probe 1 in the circumferential direction and the drive device 9 for moving the probe 1 in the machine longitudinal direction. A more detailed view of the probe support is shown in FIGS. 4 and 5.

Two drive rollers 19 are rotatably supported in each of two roller supports 8a and 8b which are held together by connecting plates 18 and screws 17. The drive rollers are each driven by a motor 20 with an attached or integrated rotation sensor 21. The drive rollers 19 interact with the external ring 16a of the radial fan 16; the external ring 16a of the radial fan 16 is thus also used as a guide path for the probe support 6. The removable supporting plates 18 permit the probe support 6 to be placed on the external ring 16a of the radial fan 16.

The drive device 9 is fitted on the surface of the drive device 8 facing the interior of the machine. The drive device 9 comprises a drive motor 22 with a cable roller 23 and an integrated or attached rotation sensor 24 for the movement of the probe 1 in the machine longitudinal direction. The two supporting cables 2, 3 are anchored on the machine-side end face 25 of the drive device 9. FIG. 5 shows (as a difference from FIG. 4) a possibility for potential isolation between the probe 1 and the probe support 6. The drive device 9 is mounted on the drive device 8 by means of screws 31 of insulating material, with a plate 30 inserted between the devices.

Figure 6:
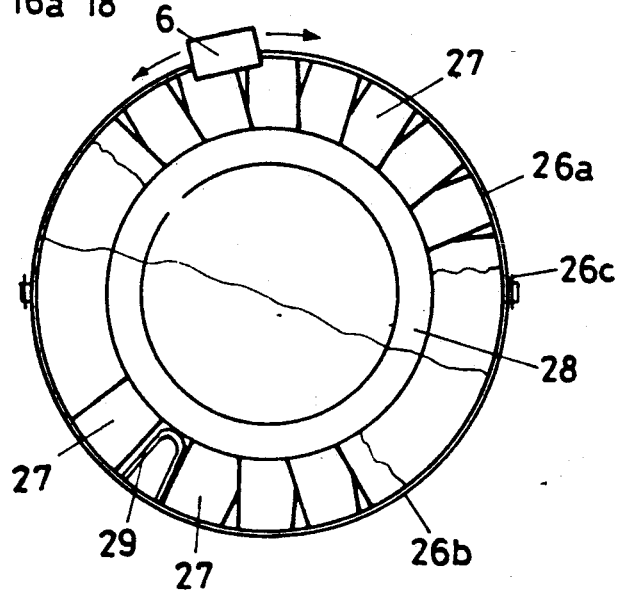
FIG. 6 shows a plan view of the end face of a turbo-generator rotor with an axial fan, on the outer circumference of which there is mounted an auxiliary device for retention of the probe support.

In the case of machines with an axial fan or fans, there is a priori no anchorage possibility/guide path for the probe support 6, 7. However, according to FIG. 6, an auxiliary device can be used in this case the form of a ring 26a, 26b, which has two or more parts and is clamped together by means of screws 26c. A further possibility is offered in the case of machines with axial fans, where individual blades 27, or all of them, can be removed without cost, since they are, for example, screwed to the hub 28 of the fan (c.f. lower half of FIG. 6). In that case, a ring which likewise has two or more parts, with the ring halves 21a and 21b, with one or more inwardly directed mounting parts 29, is fitted in place of the removed blades.

In the case of machines with only one fan — irrespective of whether it is an axial or radial type — it is invariably necessary to fit a rotationally symmetrical auxiliary structure on the machine side without a fan, in order to anchor the supporting cables 2, 3 and to fix the guide roller for the tension cable. However, this can be achieved with an auxiliary device which is comparable to that according to FIG. 6, lower half. In this case, such an auxiliary device can be clamped onto the shaft.

Figure 7:
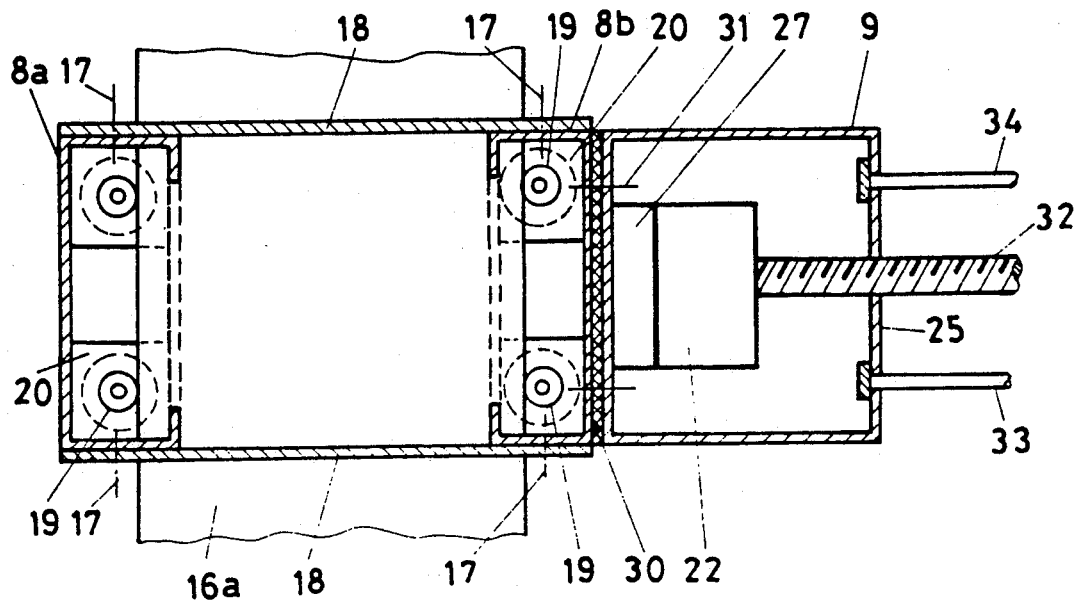
FIG. 7 shows a section through a probe support for probes, which probe support is movable by means of an axle rod and is guided in the air gap by two track rods.

In the case of electrical machines with vertical axes, the underside of the machine is often not directly accessible. In order to be able to detect partial discharges even in these machines with the stator rated voltage applied, a modification of the probe drive is expedient, as is shown schematically in FIG. 7. The drive device 8, for propulsion in the circumferential direction, corresponds to that according to FIG. 5. The drive device 9 for propulsion of the probe 1 in the machine longitudinal direction comprises a drive motor 22 coupled to an axle rod 32, with an integrated or attached rotation sensor 24. Two track rods 33, 34, anchored laterally to the end face 25, prevent sympathetic rotation of the probe 1. The probe 1 has an axle nut (not shown) connected firmly to its support. A design according to FIG. 7 is, of course, also suitable for other types of machine, particularly those with short iron lengths.

Figure 8:
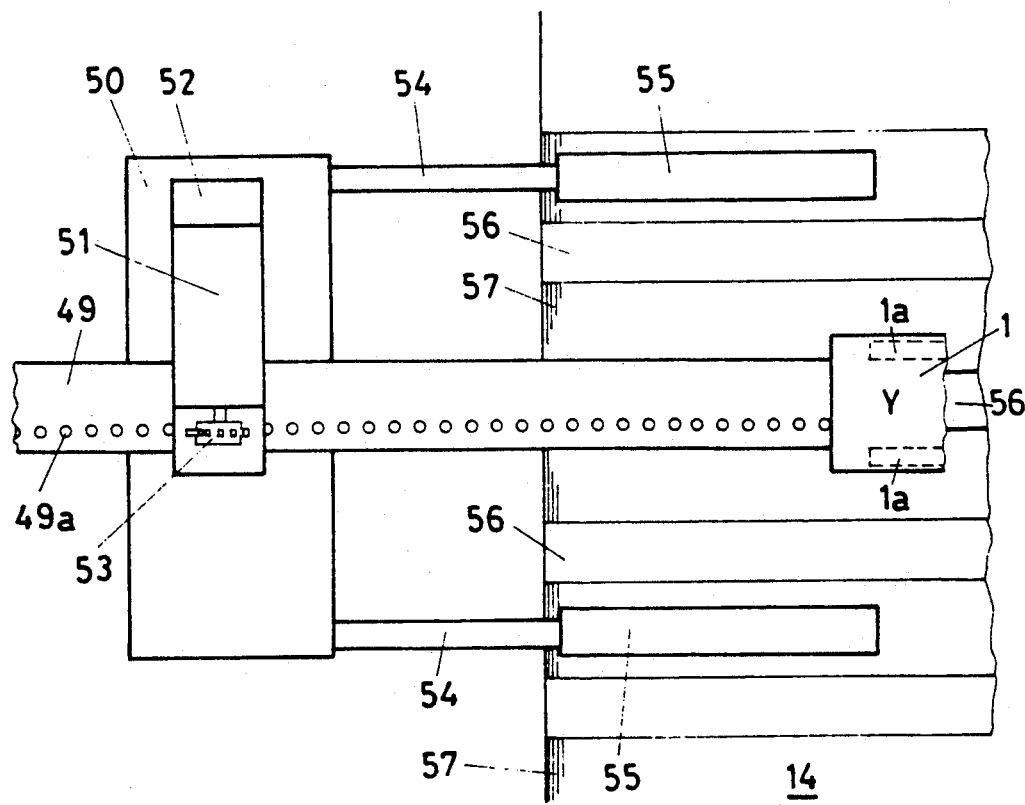
FIG. 8 shows a plan view onto a probe support for probes which can be moved in the air gap by means of a tension strip.

For machines with vertical axes and for machines with horizontal axes and short iron lengths, a variant of the probe drive is preferably used, as shown in FIG. 8. The probe 1 is mounted on the end of a perforated strip 49 of dielectric material running in the machine longitudinal direction and can be conveyed in the machine longitudinal direction by means of this perforated strip. The probe support 50, which comprises the drive device for the probe as in the previous exemplary embodiments, is arranged on the side without a drive of the machine having a horizontal or vertical axis, comprises a drive motor 51 with an integrated or attached rotation sensor 52, which drives a spiked roller 53 which engages in the holes 49a of the perforated strip 49. Two retaining rods 54, supporting retaining magnets 55 on their free ends, are fitted laterally on the probe support 50. The mean distance between the retaining rods corresponds to double the distance between two adjacent slots 56 of the stator 14. The retaining magnets 55 interact with the iron plates, more precisely with the stator teeth 57 of the stator 14. These mounting variants make a special mounting of the probe support 50 on the machine unnecessary. Permanent magnets 1a are arranged laterally on the surface of the probe 1 facing the stator 14, which permanent magnets interact with the stator teeth 57 and ensure that the probe 1 is guided on the surface of the stator bore. In addition, no drive device is required for the probe in the circumferential direction for this embodiment of the probe support or for its mounting on the machine. The probe is propelled in the circumferential direction by moving the probe support 50 manually from one slot 56 to the next.

Although the devices described above are particularly suitable, not least for cost reasons, for the detection of partial discharges in machines in which the rotor is installed, with suitable modifications of the support or holder for the probe supports these devices can also be used for machines in which the rotor is removed, for whatever reasons. It is more advantageous however 13 since it is linked to reduced cost — to use a probe for this application which is arranged on a self-propelled carriage with a dedicated drive. Remotely controlled probes, which transmit the data (Y-signal) measured by them and items of information relating to the distance (X-signal) traveled by the probe either by wireless means or by the use of wires to a remote test set, are known from other fields of technology, e.g. in the inspection of pipes and channels. The matching of such equipment to the present object merely consists of providing this equipment with the appropriate electrical fittings for reception of the AM signals initiated by the partial discharges. The plan view according to FIG. 9 and the corresponding side view according to FIG. 10 show the construction of a probe with a dedicated drive, in a simplified view.

The probe 1 is arranged between two carriages 35, 36 which are connected to one another by means of lateral trusses 37. The underside of the probe 1 has a sledge-like runner 48 (FIG. 10), which ensures that the probe is guided along the slots 56. Each carriage 35, 36 has a drive motor 38 which drives the drive wheels 41, 42 on the carriages 35, 36 via a bevel gear transmission 40. A rotation sensor 39 fitted to the carriage 36 and coupled to the drive wheel 42 supplies a signal for the position of the probe 1 in the machine longitudinal axis. The drive wheels 41, 42 drive miniature caterpillar tracks 43, 44 which are wound around rollers 45, 46. At each end of the two carriages 35, 36 there are arranged permanent magnets 47 which interact with the iron of the stator plate stack. These magnets 47 permit the vehicle to be stopped reliably at any point of the stator without having to brake its propulsion unacceptably. In order to be able to match the track width of the vehicle to the different slot geometries, lateral trusses 37 are used with various lengths and/or hole spacings.

Figure 9:
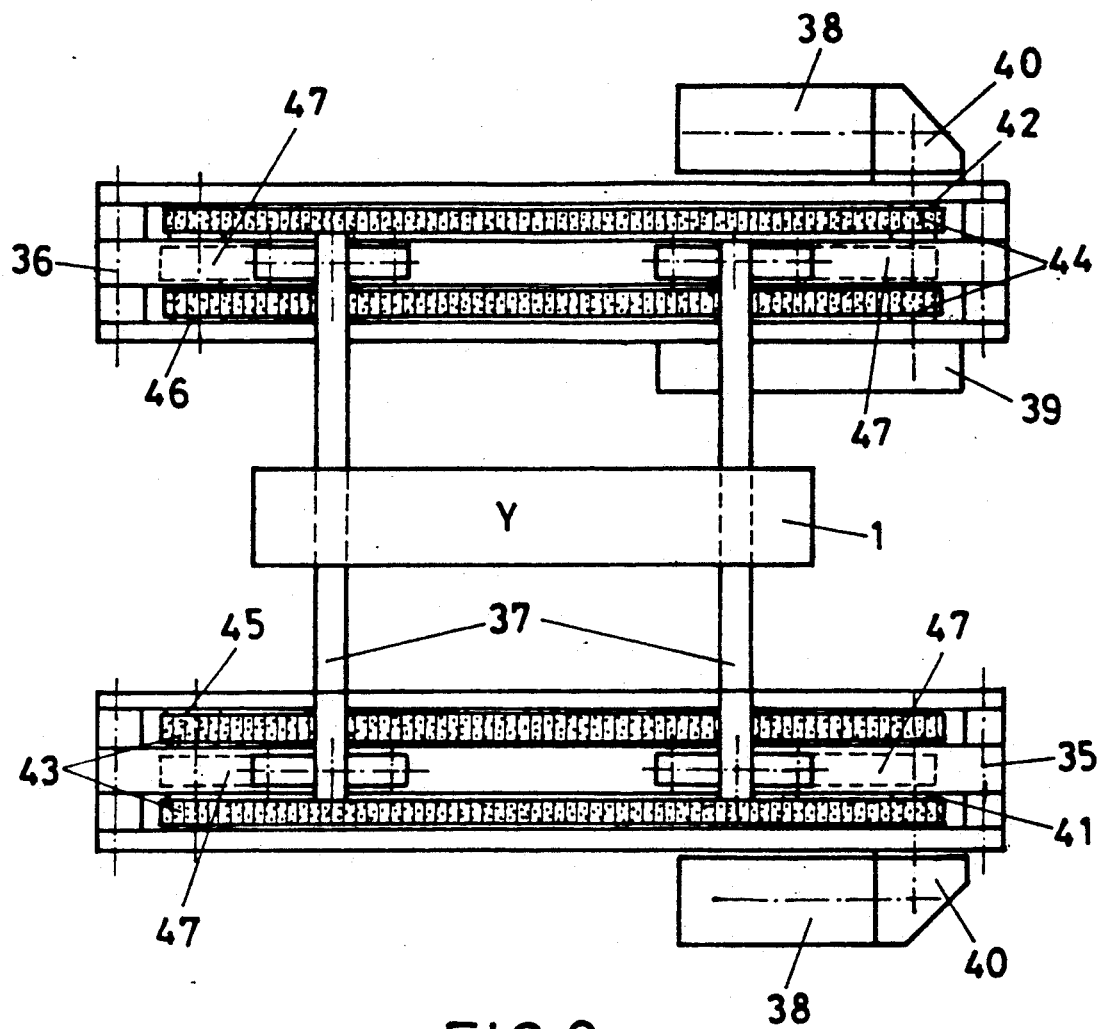
FIG. 9 shows a plan view onto a probe with a dedicated drive.
Figure 10:
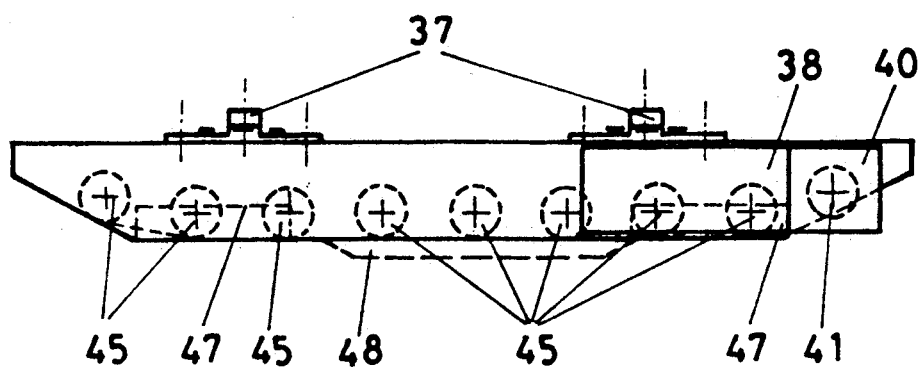
FIG. 10 shows a side view of a probe with a dedicated drive according to FIG. 9.

It is self-evident that a probe according to FIGS. 9 and 10 can also be used in the case of electrical machines with the rotor installed, provided the size of the air gap allows this.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters patent of the United States is:

1. A corona discharge monitor system for a dynamoelectric machine having a rotor and a stator, said stator having a bore and slots therein with insulated conductors in said slots, antenna means mounted on a probe for receiving radio frequency signals resulting from corona discharge in said slots as said antenna means moves along said sots in the longitudinal direction of said slots and past said slots in succession, means for transferring said radio frequency signals received by said antenna means to a place externally of said dynamoelectric machine, said system comprising:

first means for moving the probe in the longitudinal direction of said slots, comprising a probe support at one of the ends of said stator and externally of said stator bore;

second means for moving the probe in the circumferential direction of said stator bore incorporated into said probe support;

means for detecting a longitudinal and a rotational position of said probe relative to said slots for providing a positional signal representing the position of the probe, wherein the probe support is mounted on a part of the rotor of the dynamoelectric machine, said part being rotationally symmetrical with respect to the rotor axis.

2. The corona discharge monitor system according to claim 1, wherein said part of the rotor of the dynamoelectric machine is a machine fan, or an auxiliary device mounted on the machine fan, of the dynamoelectric machine.

3. The corona discharge monitor system according to claim 1 further comprising at least one axial fan, said probe support being mounted by means of an auxiliary device on the external circumference of said axial fan or on the hub of said axial fan and being movable thereon in the circumferential direction, said auxiliary device consisting essentially of a multi-part ring which is mounted on the external circumference or the hub of said axial fan.

4. The corona discharge monitor system according to claim 1, wherein said probe can be moved in the machine longitudinal direction by means of a perforated strip which is driven by a drive on said robe support, said probe support being mounted detachably on the stator by means of retaining rods with retaining magnets and being movable in the circumferential direction.

5. The corona discharge monitor system according to claim 1, wherein said probe is arranged on a carriage which, as well as the dedicated drive, has retaining magnets which interact with iron plates of the stator.

6. The corona discharge monitor system according to one of claim 1-5, wherein means are provided for detecting and recording movement of said probe in the machine longitudinal direction.

7. The corona discharge monitor system according to one of claims 1-5, wherein means are provided for detecting and recording movement of said probe in the circumferential direction.

8. The corona discharge monitor system according to one of claims 1-5, wherein said probe has an antenna signal amplifier whose output is connected to a test set for evaluating said radio frequency signals received by said antenna means.

9. The corona discharge monitor system according to one of claims 1-5, wherein said probe includes an antenna signal amplifier and also a demodulator, wherein the antenna signal demodulated by said demodulator is supplied to said test set.

* * * * *